United States Patent
Nakajima

(10) Patent No.: US 12,395,197 B2
(45) Date of Patent: Aug. 19, 2025

(54) RADIO FREQUENCY CIRCUIT AND COMMUNICATION DEVICE

(71) Applicant: Murata Manufacturing Co., Ltd., Nagaokakyo (JP)

(72) Inventor: Reiji Nakajima, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 557 days.

(21) Appl. No.: 17/224,162

(22) Filed: Apr. 7, 2021

(65) Prior Publication Data

US 2021/0336640 A1   Oct. 28, 2021

(30) Foreign Application Priority Data

Apr. 24, 2020 (JP) .................. 2020-077682

(51) Int. Cl.
| | |
|---|---|
| H04B 1/04 | (2006.01) |
| H03F 3/24 | (2006.01) |
| H03H 7/01 | (2006.01) |
| H04B 1/00 | (2006.01) |
| H04B 1/40 | (2015.01) |
| H04B 1/56 | (2006.01) |

(52) U.S. Cl.
CPC ........... *H04B 1/0483* (2013.01); *H03F 3/245* (2013.01); *H03F 2200/165* (2013.01); *H03F 2200/171* (2013.01); *H03F 2200/267* (2013.01); *H03F 2200/294* (2013.01); *H03F 2200/451* (2013.01); *H04B 2001/0408* (2013.01)

(58) Field of Classification Search
None
See application file for complete search history.

(56) References Cited

U.S. PATENT DOCUMENTS

| | | | |
|---|---|---|---|
| 8,976,707 B2 * | 3/2015 | Aramata ................ | H04B 1/525 370/254 |
| 9,240,811 B2 * | 1/2016 | Norholm .................. | H04B 1/56 |
| 2013/0225107 A1 | 8/2013 | Lane et al. | |
| 2016/0380652 A1 | 12/2016 | Anthony et al. | |
| 2017/0338851 A1 | 11/2017 | Sugaya | |

(Continued)

FOREIGN PATENT DOCUMENTS

| | | | | |
|---|---|---|---|---|
| EP | 1220460 A2 * | 7/2002 | ........... | H04B 1/0475 |
| EP | 1480402 A1 * | 11/2004 | ........... | H03G 3/3089 |
| EP | 3471278 A1 * | 4/2019 | ............... | H04B 1/04 |

(Continued)

OTHER PUBLICATIONS

Official Communication issued in corresponding Korean Patent Application No. 10-2021-0036354, mailed on Feb. 16, 2022.

*Primary Examiner* — Pablo N Tran
(74) *Attorney, Agent, or Firm* — Keating & Bennett, LLP

(57) ABSTRACT

A radio frequency circuit is capable of sending a transmit signal of a first communication band and a transmit signal of a second communication band simultaneously and includes a transmit input terminal, a power amplifier capable of amplifying a transmit signal of the first communication band, and a filter connected between the transmit input terminal and an input terminal of the power amplifier. In the filter, a pass band is a band including a transmit band of the first communication band, and an attenuation band is a band including a transmit band of the second communication band.

14 Claims, 3 Drawing Sheets

(56) References Cited

U.S. PATENT DOCUMENTS

2019/0334486 A1    10/2019    Tsuchida

FOREIGN PATENT DOCUMENTS

| GB | 2317760 A | * | 4/1998 | ............ H03J 7/047 |
| JP | 2015-508268 A | | 3/2015 | |
| JP | 2017-017691 A | | 1/2017 | |
| JP | 2017-208656 A | | 11/2017 | |
| JP | 2019-193115 A | | 10/2019 | |
| KR | 10-2019-0104874 A | | 9/2019 | |

* cited by examiner

RADIO FREQUENCY CIRCUIT AND COMMUNICATION DEVICE

CROSS REFERENCE TO RELATED APPLICATIONS

This application claims the benefit of priority to Japanese Patent Application No. 2020-077682 filed on Apr. 24, 2020. The entire contents of this application are hereby incorporated herein by reference.

BACKGROUND OF THE INVENTION

1. Field of the Invention

The present invention relates to radio frequency circuits and communication devices.

2. Description of the Related Art

There is a demand for radio frequency circuits capable of sending radio frequency signals of different frequencies simultaneously.

In FIG. 2B of Japanese Unexamined Patent Application Publication No. 2017-17691, a circuit configuration of an electronic system (radio frequency front-end module) including a first transmit circuit and a second transmit circuit is disclosed. Specifically, the first transmit circuit includes a first power amplifier that amplifies a radio frequency signal of one frequency region (first frequency band group), a first antenna switch, a first band selection switch arranged in a first signal path that connects the first power amplifier and the first antenna switch, and a plurality of first filters (duplexer) connected to the first band selection switch. The second transmit circuit includes a second power amplifier that amplifies a radio frequency signal of another frequency region (second frequency band group), a second antenna switch, a second band selection switch arranged in a second signal path that connects the second power amplifier and the second antenna switch, and a plurality of second filters (duplexer) connected to the second band selection switch. This enables to simultaneously send a first transmit signal output from the first transmit circuit and a second transmit signal output from the second transmit circuit.

However, when the first transmit signal output from the first power amplifier and the second transmit signal output from the second power amplifier are sent simultaneously, the second transmit signal yet to be input to the second power amplifier may sometimes reach an input terminal of the first power amplifier. In this case, in the first power amplifier, intermodulation distortion caused by the first transmit signal and the second transmit signal may occur. This leads to an issue of degradation of quality of a radio frequency signal output from the first power amplifier.

SUMMARY OF THE INVENTION

Preferred embodiments of the present invention provide radio frequency circuits and communication devices, in each of which the quality degradation of a transmit signal is reduced or prevented when a plurality of transmit signals is sent simultaneously.

A radio frequency circuit according to a preferred embodiment of the present invention for sending a transmit signal of a first communication band and a transmit signal of a second communication band simultaneously and includes a first transmit input terminal, a first power amplifier to amplify a transmit signal of the first communication band, and a first filter connected between the first transmit input terminal and an input terminal of the first power amplifier, a pass band of the first filter includes a transmit band of the first communication band, and an attenuation band of the first filter includes a transmit band of the second communication band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
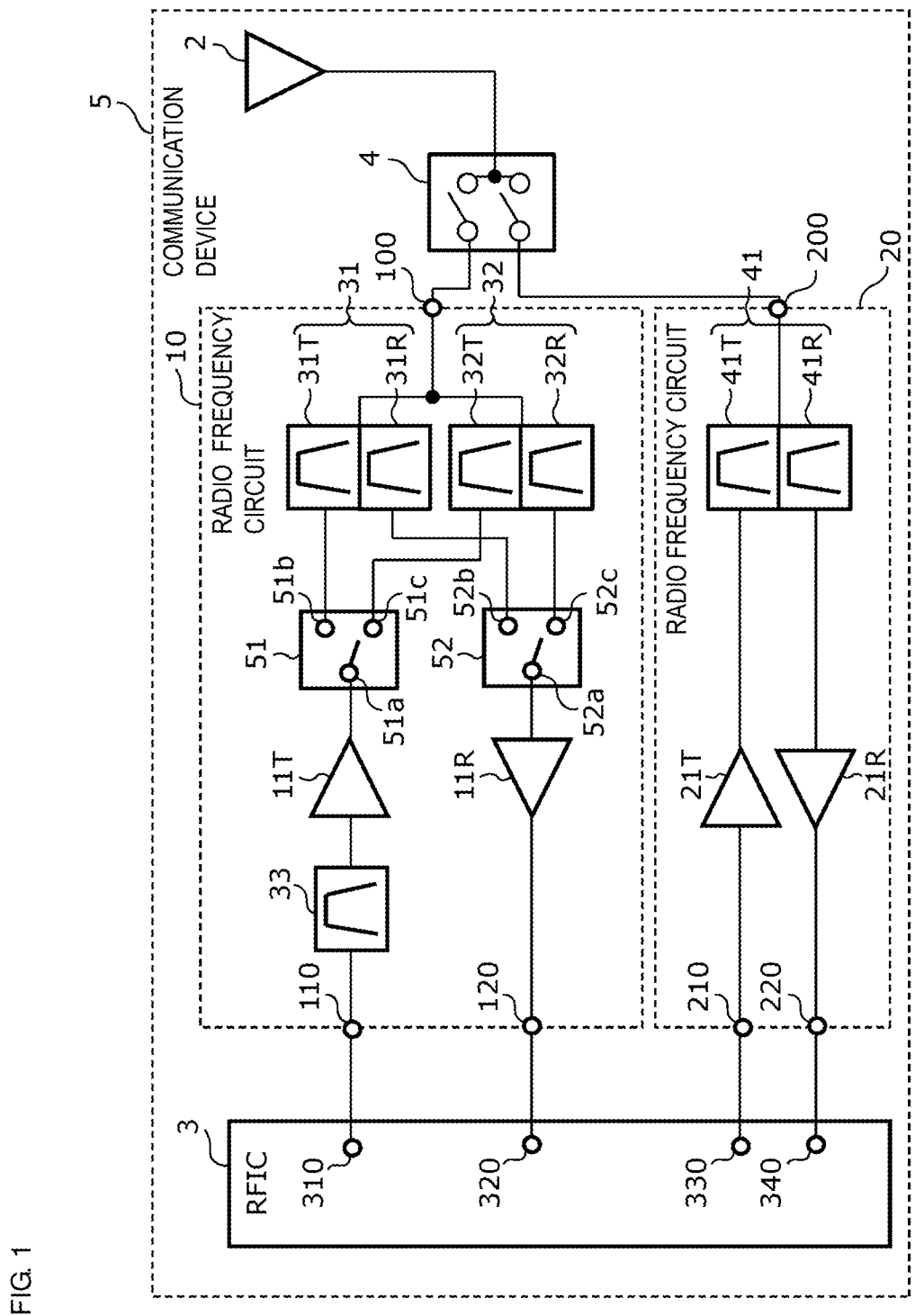
FIG. 1 is a circuit configuration diagram of a radio frequency circuit and a communication device according to a preferred embodiment of the present invention.

Hereinafter, preferred embodiments of the present invention will be described in detail with reference to the drawings. Note that the preferred embodiments which will be described below illustrate comprehensive or specific examples. Numeric values, shapes, materials, elements, arrangements and connection configurations of the elements, and the like illustrated in the following preferred embodiments are mere examples, and not intended to limit the present invention. Of elements in the following preferred embodiments and modified examples, the elements that are not described in an independent claim will be described as optional elements. Further, dimensions or ratios of the dimensions of elements illustrated in the drawings are not necessarily precise. Further, in the drawings, the same reference characters denote the same or substantially the same elements, and in some cases an overlapping description is omitted or simplified.

In the following section, a "transmit path", a "receive path", and a "bypass path" are each defined to mean a transmission line including a wiring line over which a radio frequency signal travels, an electrode directly connected to the wiring line, a terminal directly connected to the wiring line or the electrode, and the like, for example.

PREFERRED EMBODIMENT

1. Configuration of Radio Frequency Circuit and Communication Device

FIG. 1 is a circuit configuration diagram of a radio frequency circuit 10 and a communication device 5 according to a preferred embodiment of the present invention. As illustrated in FIG. 1, the communication device 5 includes the radio frequency circuit 10, a radio frequency circuit 20, an antenna 2, a RF signal processing circuit (RFIC) 3, and a switch 4.

The RFIC 3 is a RF signal processing circuit that performs processing on radio frequency signals being sent or received by the antenna 2, performs signal processing on receive signals input via receive paths of the radio frequency circuits 10 and 20 using down-converting and the like, and outputs receive signals generated by this signal processing to a base band signal processing circuit (BBIC: not illustrated). Furthermore, the RFIC 3 performs signal processing on transmit signals input from the BBIC using up-converting and the like, for example, and outputs transmit signals generated by this signal processing to transmit paths of the radio frequency circuits 10 and 20.

Particularly, the RFIC 3 is capable of simultaneously outputting transmit signals of different communication bands to the radio frequency circuits 10 and 20.

In the present preferred embodiment, the RFIC 3 includes a terminal 310 capable of sending a transmit signal of a first communication band and a transmit signal of a third communication band, a terminal 320 capable of receiving a receive signal of the first communication band and a receive signal of the third communication band, a terminal 330 capable of sending a transmit signal of a second communication band, and a terminal 340 capable of receiving a receive signal of the second communication band.

Note that each of the first communication band, the second communication band, and the third communication band may be, for example, one of communication bands used in the fourth generation mobile communication system (4G) and communication bands used in the fifth generation mobile communication system (5G).

The RFIC 3 also defines and functions as a control unit that controls the connection of the switch 4 and the connections of switches 51 and 52 included in the radio frequency circuit 10 based on a communication band (frequency band) being used. Specifically, the RFIC 3 switches between the connections of the foregoing respective switches using control signals (not illustrated). Note that the control unit may be provided outside the RFIC 3, or may be provided, for example, inside the radio frequency circuit 10 or 20 or the BBIC.

The switch 4 includes a common terminal, a first selection terminal, and a second selection terminal. The common terminal is connected to the antenna 2, the first selection terminal is connected to an input/output terminal 100 of the radio frequency circuit 10, and the second selection terminal is connected to an input/output terminal 200 of the radio frequency circuit 20. According to this configuration, the switch 4 switches between connecting and disconnecting the antenna 2 to/from the radio frequency circuit 10 and between connecting and disconnecting the antenna 2 to/from the radio frequency circuit 20. That is to say, the switching operation of the switch 4 enables executing one of the following operations: (1) connecting the antenna 2 to the radio frequency circuit 10 and connecting the antenna 2 to the radio frequency circuit 20; (2) connecting the antenna 2 to the radio frequency circuit 10 and disconnecting the antenna 2 from the radio frequency circuit 20; and (3) disconnecting the antenna 2 from the radio frequency circuit 10 and connecting the antenna 2 to the radio frequency circuit 20. Alternatively, the switch 4 may be omitted, and the antenna 2 may be directly connected to the radio frequency circuits 10 and 20.

The antenna 2 is connected to the common terminal of the switch 4 and radiates a transmit signal of the first communication band and a transmit signal of the second communication band or receives signals.

Note that in the communication device 5 according to the present preferred embodiment, the antenna 2, the switch 4, and the BBIC are not necessary elements.

Next, configurations of the radio frequency circuits 10 and 20 are described.

As illustrated in FIG. 1, the radio frequency circuit 10 includes the input/output terminal 100, a transmit input terminal 110, a receive output terminal 120, a power amplifier 11T, a low noise amplifier 11R, a filter 33, duplexers 31 and 32, and the switches 51 and 52.

The transmit input terminal 110 is an example of a first transmit input terminal and is connected to the terminal 310 of the RFIC 3. The receive output terminal 120 is connected to the terminal 320 of the RFIC 3. The input/output terminal 100 is connected to a common terminal of the duplexer 31 and a common terminal of the duplexer 32.

The power amplifier 11T is an example of a first power amplifier and is capable of amplifying transmit signals of the first communication band and the third communication band.

The filter 33 is an example of a first filter and is connected to the transmit input terminal 110 at one end portion and to an input terminal of the power amplifier 11T at the other end portion. The filter 33 has a bandpass characteristic in which a pass band is a band including a transmit band of the first communication band and an attenuation band is a band including a transmit band of the second communication band. Note that the filter 33 may be any one of a band pass filter, a low pass filter, a high pass filter, and a band stop filter, provided that the filter has a bandpass characteristic that satisfies the foregoing bandpass characteristic. The filter 33 may be, for example, a LC filter including one or more inductors and one or more capacitors. This enables, for example, at least one of the inductor and the capacitor of the LC filter to also define and function as an inductor or a capacitor of the power amplifier 11T.

The low noise amplifier 11R is an example of a first low noise amplifier and is capable of amplifying a receive signal of the first communication band and a receive signal of the third communication band. An output terminal of the low noise amplifier 11R is connected to the receive output terminal 120.

Note that the power amplifier 11T and the low noise amplifier 11R each include, for example, a field-effect transistor (FET), a heterojunction bipolar transistor (HBT), or the like, which preferably includes, for example, Si-based complementary metal oxide semiconductor (CMOS) or GaAs as a material.

The duplexer 31 is a multiplexer including a transmit filter 31T and a receive filter 31R. A pass band of the transmit filter 31T is a transmit band of the first communication band, and a pass band of the receive filter 31R is a receive band of the first communication band.

The duplexer 32 is a multiplexer including a transmit filter 32T and a receive filter 32R. A pass band of the transmit filter 32T is a transmit band of the third communication band, and a pass band of the receive filter 32R is a receive band of the third communication band.

Note that each of the duplexers 31 and 32 may not necessarily be a duplexer and may alternatively be a single filter that performs transmission using a time division duplex (TDD) system. In this case, the single filter is preceded and/or followed by a switch that switches between sending and receiving.

The switch 51 includes a common terminal 51a and selection terminals 51b and 51c. The common terminal 51a is connected to an output terminal of the power amplifier 11T, the selection terminal 51b is connected to an input terminal of the transmit filter 31T, and the selection terminal 51c is connected to an input terminal of the transmit filter 32T. The connection configuration enables the switch 51 to switch between connecting the power amplifier 11T to the transmit filter 31T and connecting the power amplifier 11T to the transmit filter 32T. The switch 51 preferably includes, for example, a single pole double throw (SPDT) switch circuit.

The switch 52 includes a common terminal 52a and selection terminals 52b and 52c. The common terminal 52a is connected to an input terminal of the low noise amplifier 11R, the selection terminal 52b is connected to an output terminal of the receive filter 31R, and the selection terminal 52c is connected to an output terminal of the receive filter 32R. The connection configuration enables the switch 52 to switch between connecting the low noise amplifier 11R to the receive filter 31R and connecting the low noise amplifier 11R to the receive filter 32R. The switch 52 preferably includes, for example, a SPDT switch circuit.

Note that the low noise amplifier 11R and at least one of the switches 51 and 52 may be defined by a single semiconductor IC. The semiconductor IC is preferably, for example, made of CMOS. Specifically, the semiconductor IC is preferably formed by a silicon-on-insulator (SOI) process, for example. This enables fabrication of the semiconductor IC inexpensively. Note that the semiconductor IC may be made of at least one of GaAs, SiGe, and GaN, for example. This enables output of a radio frequency signal with high quality amplification performance and noise performance.

The foregoing configuration enables the radio frequency circuit 10 to selectively perform the sending and receiving of a radio frequency signal of the first communication band and the sending and receiving of a radio frequency signal of the third communication band.

Note that it is only necessary for the radio frequency circuit 10 to at least send a radio frequency signal of the first communication band. In this case, the radio frequency circuit 10 only needs to include the power amplifier 11T and the transmit filter 31T, and other circuit elements are not necessary elements.

As illustrated in FIG. 1, the radio frequency circuit 20 includes the input/output terminal 200, a transmit input terminal 210, a receive output terminal 220, a power amplifier 21T, a low noise amplifier 21R, and a duplexer 41.

The transmit input terminal 210 is an example of a second transmit input terminal and is connected to the terminal 330 of the RFIC 3. The receive output terminal 220 is connected to the terminal 340 of the RFIC 3. The input/output terminal 200 is connected to the common terminal of the duplexer 41.

The power amplifier 21T is an example of a second power amplifier and is capable of amplifying a transmit signal of the second communication band. An input terminal of the power amplifier 21T is connected to the transmit input terminal 210.

The low noise amplifier 21R is capable of amplifying a receive signal of the second communication band. An output terminal of the low noise amplifier 21R is connected to the receive output terminal 220.

Note that the power amplifier 21T and the low noise amplifier 21R each preferably include, for example, a field effect transistor (FET), a heterojunction bipolar transistor (HBT), or the like, which uses Si-based CMOS or GaAs as a material.

The duplexer 41 is a multiplexer including a transmit filter 41T and a receive filter 41R. A pass band of the transmit filter 41T is a transmit band of the second communication band, and a pass band of the receive filter 41R is a receive band of the second communication band. An input terminal of the transmit filter 41T is connected to an output terminal of the power amplifier 21T, and an output terminal of the receive filter 41R is connected to an input terminal of the low noise amplifier 21R.

The foregoing configuration enables the radio frequency circuit 20 to perform the sending and receiving of a radio frequency signal of the second communication band.

According to the foregoing configuration of the communication device 5, it becomes possible to simultaneously send a transmit signal of the first communication band and a transmit signal of the second communication band or to simultaneously send a transmit signal of the third communication band and a transmit signal of the second communication band.

Figure 2:
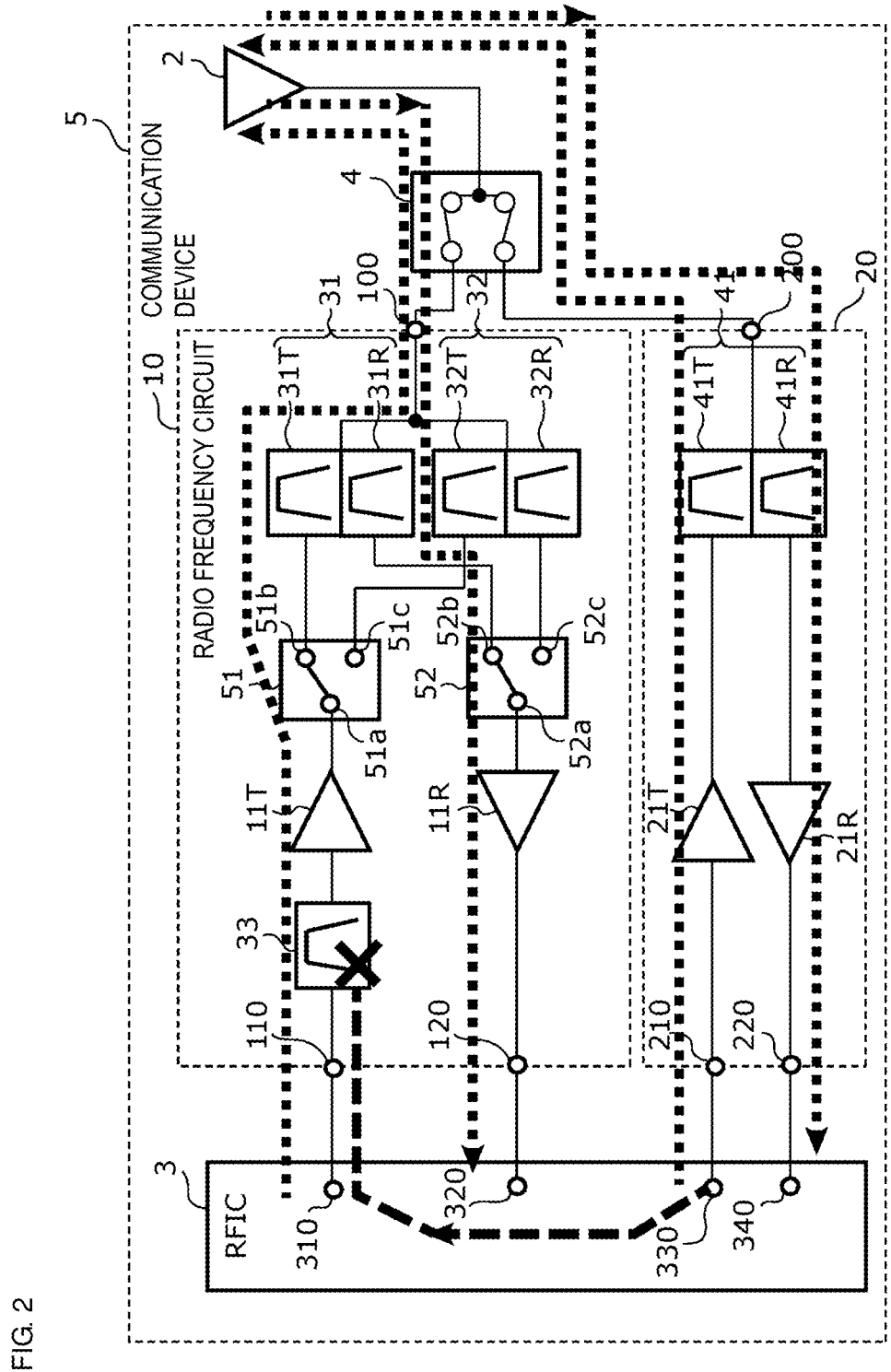
FIG. 2 is a diagram illustrating signal flows in a communication device according to a preferred embodiment of the present invention.

FIG. 2 is a diagram illustrating signal flows in the communication device 5 according to the present preferred embodiment. FIG. 2 illustrates a state where simultaneous transmission of a transmit signal and a receive signal of the first communication band and a transmit signal and a receive signal of the second communication band is being performed.

In the radio frequency circuit 10, a transmit signal of the first communication band is output from the terminal 310 of the RFIC 3, transmitted via the transmit input terminal 110, the filter 33, the power amplifier 11T, the switch 51, the transmit filter 31T, the input/output terminal 100, and the switch 4 in this order, and sent from the antenna 2. At the same time, a receive signal of the first communication band is received by the antenna 2, transmitted via the switch 4, the input/output terminal 100, the receive filter 31R, the switch 52, the low noise amplifier 11R, and the receive output terminal 120 in this order, and received at the terminal 320 of the RFIC 3.

On the other hand, in the radio frequency circuit 20, at the same time as when sending and receiving in the first communication band are performed in the radio frequency circuit 10, a transmit signal of the second communication band is output from the terminal 330 of the RFIC 3, transmitted via the transmit input terminal 210, the power amplifier 21T, the transmit filter 41T, the input/output terminal 200, and the switch 4 in this order, and sent from the antenna 2. At the same time, a receive signal of the second communication band is received by the antenna 2, transmitted via the switch 4, the input/output terminal 200, the receive filter 41R, the low noise amplifier 21R, and the receive output terminal 220 in this order, and received at the terminal 340 of the RFIC 3.

Here, as described above, when a transmit signal of the first communication band and a transmit signal of the second communication band are being sent simultaneously, the transmit signal of the second communication band output from the terminal 330 may sometimes enter the radio frequency circuit 10 through the transmit input terminal 110 via the terminal 310 of the RFIC 3. In this case, it is envisaged that intermodulation distortion caused by the transmit signal of the first communication band and the transmit signal of the second communication band may occur in the power amplifier 11T. In the case where an unwanted wave of this intermodulation distortion overlaps the transmit signal of the first communication band, there is an issue that a transmit signal output from the radio frequency circuit 10 may not be able to satisfy preset standards (spurious emission standards and the like, for example).

Whereas, according to the radio frequency circuit 10 of the present preferred embodiment, the power amplifier 11T is preceded by the filter 33 whose attenuation band is a band including a transmit band of the second communication band, and thus it becomes possible to reduce or prevent the transmit signal of the second communication band from entering the power amplifier 11T. This enables a reduction or prevention of the occurrence of the intermodulation distortion caused by the transmit signal of the first communication band and the transmit signal of the second communication band in the power amplifier 11T. Accordingly, the degradation of signal quality of a transmit signal sent from the radio frequency circuit 10 is reduced or prevented.

Note that the filter 33 may have a variable pass band. This enables, for example, varying of the pass band of the filter 33 depending on the frequency of the transmit signal of the second communication band entering through the transmit input terminal 110. Accordingly, it becomes possible to reduce or prevent the degradation of signal quality of a transmit signal sent from the radio frequency circuit 10 with a high degree of accuracy.

Furthermore, there is a concern that an unwanted wave of the intermodulation distortion caused by the transmit signal of the first communication band and the transmit signal of the second communication band and occurring in the power amplifier 11T may enter the receive path via the switch 51, the transmit filter 31T, the receive filter 31R, the switch 52, and the low noise amplifier 11R.

Whereas, according to the radio frequency circuit 10 of the present preferred embodiment, the power amplifier 11T is preceded by the filter 33 whose attenuation band is a band including a transmit band of the second communication band, and thus it becomes possible to reduce or prevent the intermodulation distortion from entering the receive path. Accordingly, the degradation of the receiving sensitivity of the radio frequency circuit 10 is reduced or prevented.

Note that the radio frequency circuit 10 according to the present preferred embodiment may include the radio frequency circuit 20. In this case, for example, circuit elements of the radio frequency circuit 10 and circuit elements of the radio frequency circuit 20 may be provided on the same mounting board. Alternatively, circuit elements of the radio frequency circuit 10 and circuit elements of the radio frequency circuit 20 may be included in the same package. In this case, the low noise amplifiers 11R and 21R and the switches 51 and 52 may be defined by a single semiconductor IC. Furthermore, the power amplifiers 11T and 21T may be defined by a single semiconductor IC.

In this case, downsizing of the radio frequency circuit is facilitated. Although there is a concern that the transmit signal of the second communication band may enter the power amplifier 11T via the transmit input terminal 110 more easily, the power amplifier 11T is preceded by the filter 33. Accordingly, it becomes possible to reduce or prevent the degradation of quality of a transmit signal of the first communication band while downsizing the radio frequency circuit 10.

In the radio frequency circuits 10 and 20 according to the present preferred embodiment, the circuit elements of the radio frequency circuit 10 and the circuit elements of the radio frequency circuit 20 may be provided on different mounting boards.

In the radio frequency circuits 10 and 20 according to the present preferred embodiment, preferably, for example, Band 5 (transmit band: 824-849 MHz, receive band: about 869-894 MHz) of 4G-Long Term Evolution (LTE) is used as the first communication band. Furthermore, Band 66 (transmit band: about 1710-1780 MHz, receive band: about 2110-2200 MHz) of 4G-LTE is used as the second communication band. At this time, the frequency of a second order intermodulation distortion (IMD2: $f_{T2}$-$f_{T1}$) caused by a transmit signal of the first communication band ($f_{T1}$: about 835 MHz) and a transmit signal of the second communication band ($f_{T2}$: about 1715 MHz) is about 880 MHz and is included in the receive band of Band 5.

Whereas, according to the radio frequency circuit 10 of the present preferred embodiment, the power amplifier 11T is preceded by the filter 33 whose attenuation band is a band including the transmit band of Band 66 of 4G-LTE, and thus it becomes possible to reduce or prevent the intermodulation distortion IMD2 from entering a receive path of Band 5 of 4G-LTE. Accordingly, the degradation of the receiving sensitivity of the radio frequency circuit 10 is reduced or prevented.

Note that typically, frequencies of the intermodulation distortion caused by two transmit signals (T1 and T2) include $3f_{T1}$-$2f_{T2}$, $2f_{T2}$-$2f_{T1}$, $2f_{T1}$-$f_{T2}$, $2f_{T2}$-$f_{T1}$, $f_{T1}$-$f_{T2}$, and $f_{T2}$-$f_{T1}$, but are not limited thereto and include ones defined by $mf_{T1}\pm nf_{T2}$ and $mf_{T2}\pm nf_{T1}$ (m and n are natural numbers).

In the present preferred embodiment, for example, a radio frequency signal transmitted in the radio frequency circuit 10 may be used in 4G, a radio frequency signal transmitted in the radio frequency circuit 20 may be used in 5G, and a radio frequency signal transmitted in the radio frequency circuit 10 and a radio frequency signal transmitted in the radio frequency circuit 20 may be sent simultaneously using Dual Connectivity (DC).

In recent years, for example, as a preparation step for making a transition from 4G to 5G, a technology called NSA has been developed to perform 5G communication using a 4G-LTE communication network. In NSA, in order to increase the communication data volume, a DC technology is being developed to allow simultaneous sending and receiving of two radio frequency signals used in different communication systems (4G-LTE and 5G-NR (New Radio) within the same communication band.

With regard to this, the radio frequency circuits 10 and 20 according to the present preferred embodiment enable a reduction or prevention of quality degradation of transmit signals and a reduction or prevention of degradation of the receiving sensitivity without limiting the combination of two communication bands to be sent simultaneously even in the case where simultaneous sending is performed using the DC technology of 4G and 5G.

2. Configuration of Radio Frequency Circuit According to Modified Example 1

Figure 3:
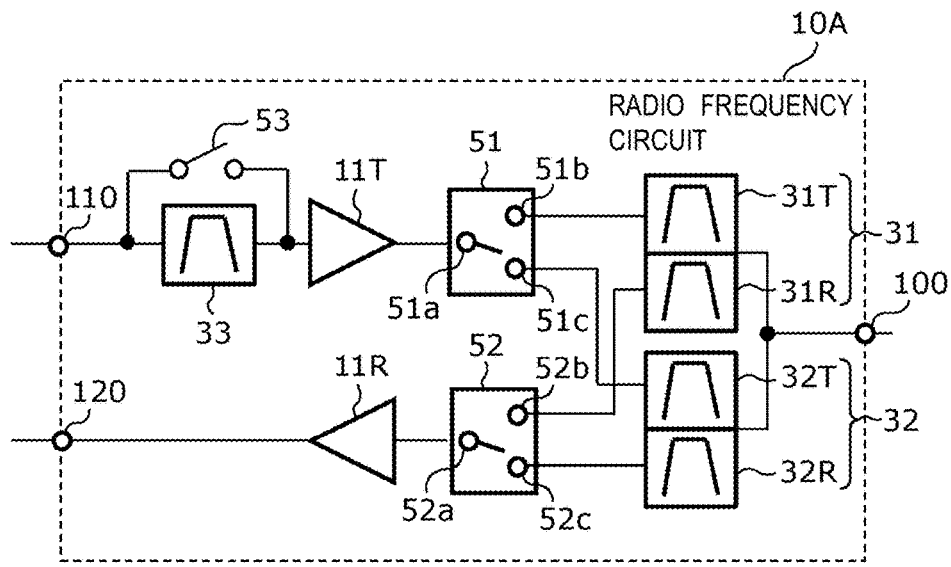
FIG. 3 is a circuit configuration diagram of a radio frequency circuit according to a modified example 1 of a preferred embodiment of the present invention.

FIG. 3 is a circuit configuration diagram of a radio frequency circuit 10A according to a modified example 1 of a preferred embodiment of the present invention. As illustrated in FIG. 3, the radio frequency circuit 10A according to the present modified example includes the input/output terminal 100, the transmit input terminal 110, the receive output terminal 120, the power amplifier 11T, the low noise amplifier 11R, the filter 33, the duplexers 31 and 32, the switches 51 and 52, and a switch 53. The radio frequency circuit 10A according to the present modified example is different from the radio frequency circuit 10 according to the present preferred embodiment in that the switch 53 is added. Hereinafter, the radio frequency circuit 10A according to the present modified example is described with the emphasis on elements different from the radio frequency module 10 according to the present preferred embodiment while omitting the descriptions regarding the same or corresponding elements.

The switch 53 is an example of a first switch, is connected to an input terminal and an output terminal of the filter 33, and switches between bypassing and non-bypassing the filter 33. Specifically, by being set to the conductive state, the switch 53 provides electrical continuity of a bypass path connecting the input terminal and the output terminal of the filter 33. On the other hand, the switch 53 makes the foregoing bypass path electrically discontinuous by being set to a non-conductive state. The switch 53 preferably includes, for example, a single pole single throw (SPST) switch circuit.

The foregoing configuration enables selection of whether a transmit signal of the second communication band entering through the transmit input terminal 110 is allowed to pass or bypass the filter 33 depending on the frequency of this transmit signal.

Suppose the following case: when a transmit signal of the first communication band and a transmit signal of the second communication band are transmitted simultaneously, there is a possibility that an unwanted wave of the intermodulation distortion caused by these two transmit signals may degrade the signal quality of the transmit signal of the first communication band output from the radio frequency circuit 10A or may degrade the receiving sensitivity of the radio frequency circuit 10A; and when a transmit signal of the third communication band and a transmit signal of the second communication band are transmitted simultaneously, an unwanted wave of the intermodulation distortion caused by these two transmit signals does not degrade the signal quality of the transmit signal of the third communication band output from the radio frequency circuit 10A and does not degrade the receiving sensitivity of the radio frequency circuit 10A. In this supposed case, when a transmit signal of the first communication band and a transmit signal of the second communication band are transmitted simultaneously, the switch 53 is set to the non-conductive state, and a transmit signal traveling from the transmit input terminal 110 to the power amplifier 11T is allowed to pass the filter 33. Whereas, when a transmit signal of the third communication band and a transmit signal of the second communication band are transmitted simultaneously, the switch 53 is set to the conductive state, and a transmit signal traveling from the transmit input terminal 110 to the power amplifier 11T is allowed to bypass the filter 33.

According to this, when a transmit signal of the first communication band and a transmit signal of the second communication band are transmitted simultaneously, it becomes possible to reduce or prevent the degradation of signal quality of a transmit signal sent from the radio frequency circuit 10A, and when a transmit signal of the third communication band and a transmit signal of the second communication band are transmitted simultaneously, it becomes possible to reduce or prevent the transmission loss of a transmit signal of the third communication band because this transmit signal is not allowed to pass the filter 33.

3. Configuration of Radio Frequency Circuit According to Modified Example 2

Figure 4:
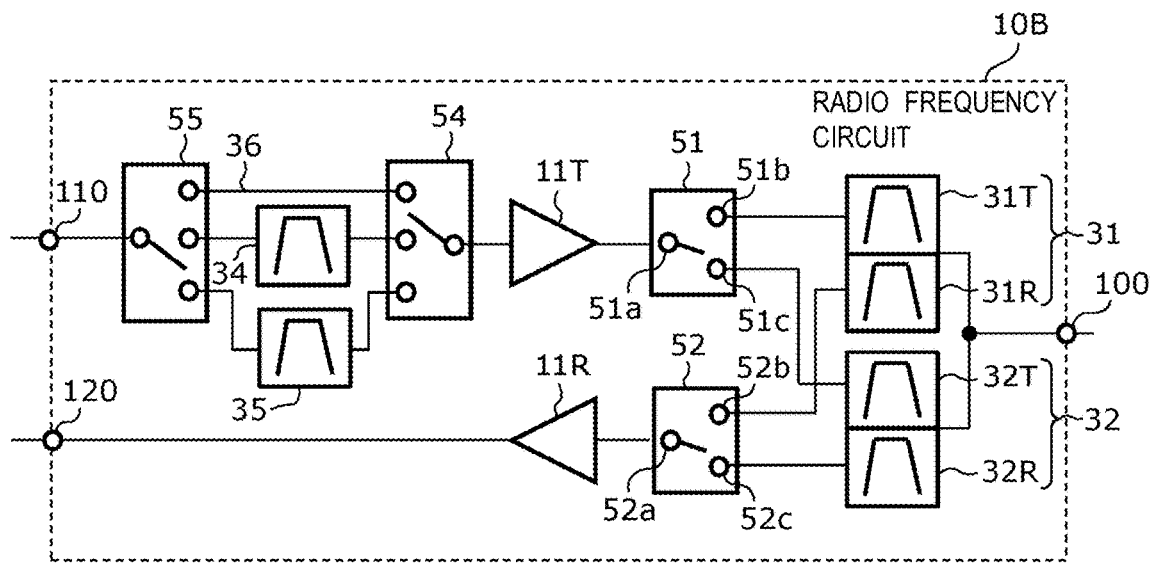
FIG. 4 is a circuit configuration diagram of a radio frequency circuit according to a modified example 2 of a preferred embodiment of the present invention.

FIG. 4 is a circuit configuration diagram of a radio frequency circuit 10B according to a modified example 2 of a preferred embodiment of the present invention. As illustrated in FIG. 4, the radio frequency circuit 10B according to the present modified example includes the input/output terminal 100, the transmit input terminal 110, the receive output terminal 120, the power amplifier 11T, the low noise amplifier 11R, filters 34 and 35, a bypass path 36, the duplexers 31 and 32, the switches 51 and 52, and switches 54 and 55. The radio frequency circuit 10B according to the present modified example is different from the radio frequency circuit 10 according to the present preferred embodiment in that, instead of the filter 33, the filters 34 and 35, the bypass path 36, and the switch 55 are added. Hereinafter, the radio frequency circuit 10B according to the present modified example is described with emphasis on elements different from the radio frequency module 10 according to the present preferred embodiment, while omitting the descriptions regarding the same or corresponding elements.

The filter 34 is an example of the first filter and is connected to the switch 54 at one end portion and to the switch 55 at the other end portion. The filter 34 has a bandpass characteristic in which a pass band is a band including a transmit band of the first communication band and an attenuation band is a band including a transmit band of the second communication band.

The filter 35 is an example of a second filter and is connected to the switch 54 at one end portion and to the switch 55 at the other end portion. The filter 35 has a bandpass characteristic in which an attenuation band is a band including a transmit band of the second communication band. Note that in the present modified example, the filter 35 has a bandpass characteristic in which a pass band is a band including a transmit band of the third communication band and an attenuation band is a band including a transmit band of the second communication band.

The switch 55 is an example of the second switch, is arranged between the transmit input terminal 110 and the filters and 35, and includes a common terminal, a first selection terminal, a second selection terminal, and a third selection terminal. The common terminal is connected to the transmit input terminal 110, the first selection terminal is connected to one end portion of the bypass path 36, the second selection terminal is connected to one end portion of the filter 34, and the third selection terminal is connected to one end portion of the filter 35. The switch 55 preferably includes, for example, a single pole 3 throw (SP3T) switch circuit. The switch 55 switches between connecting the transmit input terminal 110 to the bypass path 36, connecting the transmit input terminal 110 to the filter 34, and connecting the transmit input terminal 110 to the filter 35.

The switch 54 is arranged between the power amplifier 11T and the filters 34 and 35, and includes a common terminal, a first selection terminal, a second selection terminal, and a third selection terminal. The common terminal is connected to an input terminal of the power amplifier 11T, the first selection terminal is connected to the other end portion of the bypass path 36, the second selection terminal is connected to the other end portion of the filter 34, and the third selection terminal is connected to the other end portion of the filter 35. The switch 55 preferably includes, for example, a SP3T switch circuit. The switch 54 switches between connecting the power amplifier 11T to the bypass path 36, connecting the power amplifier 11T to the filter 34, and connecting the power amplifier 11T to the filter 35. Note that the switch 54 may be omitted.

The foregoing configuration enables selection of one from among the filters 34 and 35 and the bypass path 36 depending on the frequency and the signal strength of a transmit signal of the second communication band that enters through the transmit input terminal 110 and depending on which one of the first communication band and the third communication band is used for sending.

For example, when a transmit signal of the first communication band and a transmit signal of the second communication band are transmitted simultaneously, a transmit signal traveling from the transmit input terminal 110 to the power amplifier 11T is allowed to pass the filter 34. When a transmit signal of the third communication band and a transmit signal of the second communication band are transmitted simultaneously, a transmit signal traveling from the transmit input terminal 110 to the power amplifier 11T is allowed to pass the filter 35. When there is no need to suppress the occurrence of intermodulation distortion in the power amplifier 11T, a transmit signal traveling from the transmit input terminal 110 to the power amplifier 11T is allowed to pass the bypass path 36.

This enables a reduction or prevention of degradation of signal quality of a transmit signal sent from the radio frequency circuit 10B by allowing this transmit signal to pass the filter 34 or 35 and enables a reduction in the transmission loss of a transmit signal sent from the radio frequency circuit 10B by allowing this transmit signal to pass the bypass path 36.

As described above, the radio frequency circuit 10 according to the present preferred embodiment is capable of simultaneously sending a transmit signal of the first communication band and a transmit signal of the second communication band and includes the transmit input terminal 110, the power amplifier 11T capable of amplifying the transmit signal of the first communication band, and the filter 33 connected between the transmit input terminal 110 and the input terminal of the power amplifier 11T wherein a pass band of the filter 33 is a band including a transmit band of the first communication band and an attenuation band of the filter 33 is a band including a transmit band of the second communication band.

According to this, the power amplifier 11T is preceded by the filter 33 whose attenuation band is a band including a transmit band of the second communication band, and thus it becomes possible to reduce or prevent the transmit signal of the second communication band from entering the power amplifier 11T. This enables a reduction or prevention of the occurrence of the intermodulation distortion caused by the transmit signal of the first communication band and the transmit signal of the second communication band in the power amplifier 11T. Accordingly, the degradation of signal quality of a transmit signal sent from the radio frequency circuit 10 is reduced or prevented.

The radio frequency circuit 10 may further include the low noise amplifier 11R capable of amplifying a receive signal of the first communication band.

This enables a reduction or prevention the intermodulation distortion caused by a transmit signal of the first communication band and a transmit signal of the second communication band from entering the receive path. Accordingly, the degradation of the receiving sensitivity of the radio frequency circuit 10 is reduced or prevented.

The radio frequency circuit 10 may further include the transmit input terminal 210 and the power amplifier 21T that is connected to the transmit input terminal 210 and capable of amplifying a transmit signal of the second communication band.

This leads to a concern that the transmit signal of the second communication band may enter the power amplifier 11T from the transmit input terminal 210 via the transmit input terminal 110. However, because of the arrangement of the filter 33, it becomes possible to reduce or prevent the transmit signal of the second communication band from entering the power amplifier 11T.

The radio frequency circuit 10A may further include the switch 53 that is connected to the input terminal and the output terminal of the filter 33 and switches between bypassing and non-bypassing the filter 33.

This enables selection whether a transmit signal of the second communication band entering through the transmit input terminal 110 is allowed to pass or bypass the filter 33 depending on the frequency of this transmit signal, and thus it becomes possible to reduce the transmission loss of a transmit signal output from the radio frequency circuit 10A when the foregoing intermodulation distortion does not occur.

In the radio frequency circuit 10, the filter 33 may be a filter having a variable pass band.

This causes the pass band of the filter 33 to vary depending on the frequency of the transmit signal of the second communication band entering through the transmit input terminal 110, and thus it becomes possible to reduce or prevent the degradation of signal quality of a transmit signal sent from the radio frequency circuit 10 with a high degree of accuracy.

The radio frequency circuit 10B may include the filter 34 connected between the transmit input terminal 110 and the input terminal of the power amplifier 11T, wherein a pass band of the filter 34 is a band including a transmit band of the first communication band and an attenuation band of the filter 34 is a band including a transmit band of the second communication band, the filter 35 connected between the transmit input terminal 110 and the input terminal of the power amplifier 11T, wherein an attenuation band of the filter 35 is a band including the transmit band of the second communication band, and the switch 55 arranged between the transmit input terminal 110 and the filters 34 and 35, wherein the switch 55 switches between connecting the transmit input terminal 110 to the filter 34 and connecting the transmit input terminal 110 to the filter 35.

This enables selection of one of the filters 34 and 35 depending on the frequency and the signal strength of a transmit signal of the second communication band entering through the transmit input terminal 110 or depending on a similar variable, and thus it becomes possible to reduce or prevent the degradation of signal quality of a transmit signal sent from the radio frequency circuit 10B with a high degree of accuracy.

In the radio frequency circuit 10, the filter 33 may preferably be, for example, a LC filter including one or more inductors and one or more capacitors.

This enables, for example, at least one of the inductor and the capacitor of the LC filter to also define and function as an inductor or a capacitor of the power amplifier 11T.

The communication device 5 includes the radio frequency circuit 10 and the RFIC 3 capable of simultaneously sending a transmit signal of the first communication band and a transmit signal of the second communication band to the radio frequency circuits 10 and 20.

This reduces or prevents the degradation of signal quality of a transmit signal sent from the communication device 5.

OTHER PREFERRED EMBODIMENTS

The radio frequency circuit and the communication device according to the present preferred embodiment are described using the above-described preferred embodiment and the modified examples thereof. However, the radio frequency circuits and the communication devices of the present invention are not limited to the above-described preferred embodiment and the modified examples thereof. Other preferred embodiments obtained by combining arbitrary elements of the above-described preferred embodiment and the modified examples thereof, modified examples obtained by applying various modifications apparent to those skilled in the art to the above-described preferred embodiment and the modified examples thereof without departing the scope of the present invention, and various devices incorporating the radio frequency circuits and the communication devices according to preferred embodiments of the present invention may also be included in the present invention.

In the above-described preferred embodiment and the modified examples thereof, the cases where transmit signals of two different communication bands are transmitted simultaneously are exemplified. Alternatively, the configurations of the radio frequency circuits and the communication devices according to referred embodiments of the present invention may be applied to cases where transmit signals of three or more different communication bands are transmitted simultaneously. That is to say, preferred embodiments of the present invention include radio frequency circuits and communication devices each having a configuration that simultaneously transmits transmit signals of three or more different communication bands and include the configuration of the radio frequency circuits or the communication devices according to preferred embodiments or modified examples thereof.

Note that the combination of the first communication band and the second communication band is not limited to the combination of Band 5 of 4G-LTE and Band 66 of 4G-LTE. The combination in which the simultaneous sending of the first communication band and the second communication band would cause a second-order intermodulation distortion or a third-order intermodulation distortion in the first communication band or the second communication band is also applicable to combinations of the first communication band and the second communication band illustrated in the following Table 1. Note that in Table 1, in the case where the band with which IMD overlaps is the second communication band, the combination is applied for the case where the radio frequency circuit 10 sends a transmit signal of the second communication band and the radio frequency circuit 20 sends a transmit signal of the first communication band.

In above-described preferred embodiment, the communication system is defined to mean a communication system constructed using the radio access technology (RAT) defined by a standards body or the like (for example, 3GPP or Institute of Electrical and Electronics Engineers (IEEE)). As the communication system, for example, a 5G-NR system, a 4G-LTE system, a wireless local area network (WLAN) system, or the like may be used, but the communication system is not limited thereto.

The communication band is defined to mean a frequency band defined in advance by a standards body or the like for the communication system. As the communication band, for example, a 5G-NR frequency band, a 4G-LTE frequency band, or the like may be used, but the communication band is not limited thereto.

In the radio frequency circuits and the communication devices according to preferred embodiments of the present invention and modified examples, a matching element, such as an inductor, a capacitor, or the like, for example, and a switch circuit may be connected between circuit elements. Note that the inductor may include a wiring line inductor defined by a wiring line connecting circuit elements.

In the radio frequency circuits and the communication devices according to preferred embodiments of the present invention and modified examples, the term "A and B are connected" refers to not only a mode of connection in which A and B are directly connected without any other circuit element interposed therebetween but also a mode of connection in which A and B are indirectly connected with a passive circuit including, for example, an inductor, a capacitor, and the like, a switch circuit, or the like interposed therebetween.

The LC filter is defined to mean a filter in which a pass band of the LC filter includes one or more inductors and one or more capacitors. Accordingly, the LC filter may include, for example, an acoustic wave resonator providing an attenuation pole outside the pass band.

The control unit according to preferred embodiments of the present invention may be provided by large scale integration (LSI), which is an integrated circuit (IC). A dedicated circuit or a general-purpose processor may be used for an integrated circuit. After fabricating the LSI, a field programmable gate array (FPGA), which is programmable, or a reconfigurable processor, in which connection or setting of circuit cells in the LSI are reconfigurable, may be used. In addition, when a technology of circuit integration that can

TABLE 1

|  | FIRST COMMUNICATION BAND (Tx1, Rx1) | SECOND COMMUNICATION BAND (Tx2, Rx2) | IMD2 Tx2-Tx1 (MHz) | IMD3 2Tx2-Tx1 (MHz) | BAND WHERE IMD OVERLAPS |
|---|---|---|---|---|---|
| EXAMPLE 1 | B1 | n77 | ○ |  | B1-Tx |
| EXAMPLE 2 | B2 | B(n)66 |  | ○ | B(n)66-Tx |
| EXAMPLE 3 | B2 | n78 | ○ |  | B2-Tx |
| EXAMPLE 4 | B3 | n77 | ○ |  | B3-Tx |
| EXAMPLE 5 | B3 | n78 | ○ |  | B3-Tx |
| EXAMPLE 6 | B8 | n78 | ○ |  | n78 |
| EXAMPLE 7 | B18 | n77 | ○ |  | n77 |
| EXAMPLE 8 | B19 | n77 | ○ |  | n77 |
| EXAMPLE 9 | B20 | n8 |  | ○ | B20-Tx n8-Tx |
| EXAMPLE 10 | B20 | n77 | ○ |  | n77 |
| EXAMPLE 11 | B26 | n77 | ○ |  | n77 |
| EXAMPLE 12 | B28 | n51 | ○ |  | B28-Tx |
| EXAMPLE 13 | B28 | n77 | ○ |  | n77 |
| EXAMPLE 14 | B39 | n78 | ○ |  | B39 |
| EXAMPLE 15 | B41 | n79 | ○ |  | B41 |
| EXAMPLE 16 | B66 | n78 | ○ |  | B66-Tx | replaces the LSI emerges due to development of semiconductor technology or another technology derived therefrom, for example, the integration of the functional blocks may be performed by using such technology.

Preferred embodiments of the present invention can be widely used in communication equipment, such as mobile phones and the like, for example, as a multiband/multimode front-end module that includes a carrier aggregation system or a dual connectivity system.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A radio frequency circuit for sending a transmit signal of a first communication band and a transmit signal of a second communication band simultaneously, the radio frequency circuit comprising:
    a first transmit input terminal;
    a first power amplifier to amplify a transmit signal of the first communication band;
    a first filter connected between the first transmit input terminal and an input terminal of the first power amplifier, a pass band of the first filter being a band including a transmit band of the first communication band, an attenuation band of the first filter being a band including a transmit band of the second communication band;
    a second transmit input terminal;
    a second power amplifier connected to the second transmit input terminal to amplify a transmit signal of the second communication band; and
    an antenna switch including a first select terminal connected to the first power amplifier, a second select terminal connected to the second power amplifier, and a common terminal connectable to the first select terminal and the second select terminal; wherein
    the first filter is directly connected the input terminal of the first power amplifier.

2. The radio frequency circuit according to claim 1, further comprising a first low noise amplifier to amplify a receive signal of the first communication band.

3. The radio frequency circuit according to claim 1, further comprising a first switch connected to an input terminal and an output terminal of the first filter to switch between bypassing and not bypassing the first filter.

4. The radio frequency circuit according to claim 3, wherein the first switch includes a single pole single throw switch circuit.

5. The radio frequency circuit according to claim 1, wherein the first filter has a variable pass band.

6. The radio frequency circuit according to claim 1, wherein the first filter is a LC filter including one or more inductors and one or more capacitors.

7. A communication device comprising:
    the radio frequency circuit according to claim 1; and
    a RF signal processing circuit to send a transmit signal of the first communication band and a transmit signal of the second communication band simultaneously to the radio frequency circuit.

8. The communication device according to claim 7, further comprising a first low noise amplifier to amplify a receive signal of the first communication band.

9. The communication device according to claim 7, further comprising a first switch connected to an input terminal and an output terminal of the first filter to switch between bypassing and not bypassing the first filter.

10. The communication device according to claim 9, wherein the first switch includes a single pole single throw switch circuit.

11. The communication device according to claim 7, wherein the first filter has a variable pass band.

12. The communication device according to claim 7, wherein the first filter is a LC filter including one or more inductors and one or more capacitors.

13. The communication device according to claim 7, wherein the first power amplifier includes a field effect transistor or a heterojunction bipolar transistor.

14. The radio frequency circuit according to claim 1, wherein the first power amplifier includes a field effect transistor or a heterojunction bipolar transistor.

* * * * *